(12) United States Patent
Lee et al.

(10) Patent No.: US 9,023,558 B2
(45) Date of Patent: May 5, 2015

(54) PHOTORESIST COMPOSITION AND METHOD OF FORMING A COLOR FILTER USING THE SAME

(71) Applicant: Samsung Display Co., Ltd., Yongin (KR)

(72) Inventors: Ki-Beom Lee, Seoul (KR); Su-Yeon Sim, Changwon-si (KR); Jae-Hyuk Chang, Seongnam-si (KR); Chang-Hoon Kim, Asan-si (KR); Hi-Kuk Lee, Yongin-si (KR)

(73) Assignee: Samsung Display Co., Ltd., Yongin (KR)

( * ) Notice: Subject to any disclaimer, the term of this patent is extended or adjusted under 35 U.S.C. 154(b) by 109 days.

(21) Appl. No.: 13/655,597

(22) Filed: Oct. 19, 2012

(65) Prior Publication Data

US 2013/0302727 A1    Nov. 14, 2013

(30) Foreign Application Priority Data

May 14, 2012 (KR) ........................ 10-2012-0050756

(51) Int. Cl.
| | | |
|---|---|---|
| *G03F 7/031* | (2006.01) | |
| *G03F 7/20* | (2006.01) | |
| *G03F 7/00* | (2006.01) | |
| *G03F 7/029* | (2006.01) | |
| *G03F 7/033* | (2006.01) | |
| *G03F 7/105* | (2006.01) | |

(52) U.S. Cl.
CPC ............ *G03F 7/2051* (2013.01); *G03F 7/0007* (2013.01); *G03F 7/029* (2013.01); *G03F 7/031* (2013.01); *G03F 7/033* (2013.01); *G03F 7/105* (2013.01)

(58) Field of Classification Search
CPC ....... G03F 7/0007; G03F 7/004; G03F 7/029; G03F 7/031; G03F 7/033; G03F 7/20; G03F 7/2051; G03F 7/2053; G03F 7/2057; G02B 5/201; G02B 5/223; G02F 1/133516
USPC .................................... 430/7, 270.1; 349/106
See application file for complete search history.

(56) References Cited

U.S. PATENT DOCUMENTS

2008/0268374 A1 * 10/2008 Tashiro et al. ............. 430/280.1
2010/0119959 A1    5/2010 Nakashima et al.

FOREIGN PATENT DOCUMENTS

| JP | 09-073171 A | * | 3/1997 |
|---|---|---|---|
| JP | 2007041158 | | 2/2007 |
| JP | 2007-078892 A | * | 3/2007 |
| JP | 2008134613 | | 6/2008 |
| JP | 2009-210870 A | * | 9/2009 |
| JP | 2011-075981 A | * | 2/2011 |
| KR | 1020070070708 | | 7/2007 |

OTHER PUBLICATIONS

Computer-generated translation of JP 2011-075981 (Feb. 2011).*
Computer-generated translation of JP 2009-210870 (Sep. 2009).*
Computer-generated translation of JP 09-073171 (Mar. 1997).*
Computer-generated translation of JP 2007-078892 (Mar. 2007).*

* cited by examiner

*Primary Examiner* — John A McPherson
(74) *Attorney, Agent, or Firm* — H.C. Park & Associates, PLC (57) ABSTRACT

Exemplary embodiments of the present invention relate to a photoresist composition and method of forming a color filter using the same. A photoresist composition according to an exemplary embodiment includes about 5% by weight to about 10% by weight of a binder resin, about 5% by weight to about 10% by weight of a monomer, about 1% by weight to about 15% by weight of a photo initiator configured to be activated a light having a peak wavelength from about 400 nm to about 410 nm, about 1% by weight to about 10% by weight of a pigment, about 0.01% by weight to about 1% by weight of a pigment dispersing agent, and a solvent.

18 Claims, 3 Drawing Sheets

PHOTORESIST COMPOSITION AND METHOD OF FORMING A COLOR FILTER USING THE SAME

CROSS REFERENCE TO RELATED APPLICATION

This application claims priority from and the benefit of Korean Patent Application No. 10-2012-0050756, filed on May 14, 2012, which is hereby incorporated by reference for all purposes as if fully set forth herein.

BACKGROUND

1. Field

Exemplary embodiments of the present invention relate to a photoresist composition used for manufacturing a color filter and a method of manufacturing a color filter using the photoresist composition. More particularly, exemplary embodiments of the present invention relate to a photoresist composition used for manufacturing a color filter having photosensitivity with respect to a digital exposure apparatus, and a method of forming a color filter using the photoresist composition.

2. Discussion of the Background

A photoresist pattern may be formed from a coated layer formed by coating a photoresist composition on a base substrate, and exposing the coated layer to light and developing the coated layer. In the process of exposing the coated layer to light, a mask may be used to determine a shape of a photoresist pattern. The photoresist pattern may be an etch stop pattern for patterning a layer disposed under a photoresist pattern or may be a component constituting a substrate for a display apparatus. Changing a design of a photoresist pattern may require a mask design thereof to be changed. Since the manufacturing cost of a mask may be expensive, using more masks may increase the manufacturing cost of the display device.

A digital exposure apparatus using an optical device including micro-mirrors may be used to form a photoresist pattern without using a mask. The micro-minors may provide a plurality of spot beams on the photoresist layer to form the photoresist pattern.

However, since the digital exposure apparatus may use a light source emitting a light having a different peak wavelength than a conventional exposure apparatus configured for use with a mask, a conventional photoresist composition used with the conventional exposure apparatus may have a lower photosensitivity with respect to the light emitted by the digital exposure apparatus. Thus, when the conventional photoresist composition is used with the digital exposure apparatus, manufacturing reliability of a photoresist pattern may be decreased.

The above information disclosed in this Background section is only for enhancement of understanding of the background of the invention and therefore it may contain information that does not form any part of the prior art nor what the prior art may suggest to a person of ordinary skill in the art.

SUMMARY OF THE INVENTION

Exemplary embodiments of the present invention provide a photoresist composition for manufacturing a color filter, which may have improved sensitivity and resolution to a light source of a digital exposure apparatus.

Exemplary embodiments of the present invention also provide a method of manufacturing a color filter using the photoresist composition.

Additional features of the invention will be set forth in the description which follows, and in part will be apparent from the description, or may be learned by practice of the invention.

An exemplary embodiment of the present invention discloses a photoresist composition including about 5% by weight to about 10% by weight of a binder resin, about 5% by weight to about 10% by weight of a monomer, about 1% by weight to about 15% by weight of a photo initiator configured to be activated by light having a wavelength range from about 400 nm to about 410 nm, about 1% by weight to about 10% by weight of a pigment, about 0.01% by weight to about 1% by weight of a pigment dispersing agent, and a solvent.

An exemplary embodiment of the present invention also discloses a method of forming a color filter including a photoresist composition including a binder resin, a monomer, a photo initiator configured to be activated by light having a peak wavelength range from about 400 nm to about 410 nm, a pigment, a pigment dispersing agent, and a solvent, the photoresist composition being coated on a substrate to form a coated layer. The coated layer is exposed to light having a peak wavelength range from about 400 nm to about 410 nm using a digital exposure apparatus. The exposed coated layer is developed to form the color filter.

An exemplary embodiment of the present invention also discloses a method of forming a color filter including a photoresist composition coated on a substrate. The photoresist composition includes about 5% by weight to about 10% by weight of a binder resin, about 5% by weight to about 10% by weight of a monomer, about 1% by weight to about 15% by weight of a photo initiator configured to be activated by light having a wavelength range from about 400 to about 410 nm, about 1% by weight to about 10% by weight of a pigment, about 0.01% by weight to about 1% by weight of a pigment dispersing agent, and a solvent. The coated layer is exposed, and the coated layer is developed to form the color filter.

An exemplary embodiment of the present invention also discloses a method of forming a color filter, including coating a first photoresist composition on a substrate, the first photoresist composition including a photo initiator configured to be activated by light having a peak wavelength from about 400 nm to about 410 nm, and a first pigment, exposing the first photoresist composition to light having a peak wavelength from about 400 nm to about 410 nm, and developing the first photoresist composition.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Photoresist Composition

A photoresist composition according to an exemplary embodiment of the present invention may include a binder resin, a monomer, a photo initiator, a pigment, a pigment dispersing agent, and a solvent. Hereinafter, the above components will be respectively described in detail.

(a) Binder Resin

The binder resin according to the present exemplary embodiment serves as a main component of the photoresist composition forming a color filter. The binder resin may be a substantial substance of the color filter. For example, the binder resin may include an acrylic resin. The acrylic resin may include a polymer having more than two different copolymerized repeating units. Average molecular weight of the acrylic resin may be from about 3,000 to about 50,000 so that the photoresist composition may be stably coated on a substrate and have an appropriate density. The average molecular weight may be weight-average molecular weight converting as polystyrene.

Examples of the copolymerized monomers forming the acrylic resin may include methcrylic acid, acrylic acid, crotonic acid, maleic acid, vinyl pyrrolidone, styrene monomer, methyl methacrylate, benzyl methcrylate, 2-hydroxyethyl methcrylate, aryl methcrylate, or glycidyl methcrylate, etc. At least one of the acrylic monomers compounds may be polymerized to form the acrylic resin. In the process of manufacturing the acrylic resin, a thermal initiator may be used for polymerization of the acrylic monomers. Examples of the thermal initiator may include 2,2'-azobis(2,4-dimethyl)valeronitrile. An amount of the thermal initiator may be about 5% by weight to about 20% by weight based on the total weight of composition for manufacturing the acrylic resin. Furthermore, examples of inhibitors to stop polymerization of the acrylic monomers may include 4-hydroxybenzophenone. Using the inhibitors, average molecular weight of the acrylic resin may be controlled from about 3,000 to about 50,000. An amount of the inhibitors may be about 0% by weight to about 1% by weight based on the total weight of composition for manufacturing the acrylic resin.

When an amount of the binder resin is less than about 5% by weight based on the total weight of the photoresist composition, amount of the binder resin may be insufficient. Thus, the photoresist composition may be hardly coated on the substrate, and shape stability of a coated layer formed by the photoresist composition may be low. Alternatively, when an amount of the binder resin is greater than about 10% by weight based on the total weight of the photoresist composition, viscosity of the photoresist composition may be increased, and dispersibility in the solvent may be decreased. Thus, the photoresist composition may not be coated uniformly on the substrate. Thus, an amount of the binder resin may be about 5% by weight to about 10% by weight based on the total weight of the photoresist composition.

(b) Monomer

The monomer according to the present exemplary embodiment serves to control a photo-curing speed of the binder resin. Thus, reaction speed of the photoresist composition with respect to an applied light may be increased by the monomer. In the process of heat-treating a coated layer formed from the photoresist composition, the monomer may promote a cross linking reaction of the binder resin. The monomer used in the photoresist composition may include a multi-functional monomer, a mono-functional monomer, or both the multi-functional monomer and the mono-functional monomer. In order to control sensitivity of the photoresist composition, the multi-functional monomer and the mono-functional monomer may be selectively mixed.

Examples of the multi-functional monomer include dipentaerythritol hexaacrylate, pentaerythritol triacrylate, pentaerythritol tetraacrylate, trimethylpropane triacrylate, trimethylpropane trimethacrylate, glycerol triacrylate, tris(2-hydroxy ethyl)isocyanurate triacrylate, di-trimethylpropane tetraacrylate, dipentaerythritol pentaacrylate, pentaerythritol tetraacrylate, etc. These can be used alone or in combination with each other.

Examples of the mono-functional monomer include glycidyl methcrylate, hydroxyethyl methcrylate, 2-hydroxy 3-phenoxy propyl acrylate, diethylene glycol methyl ether methcrylate, hydroxy ethyl acrylate, butyl methcrylate, hydroxy propylacrylate, 2-phenoxyethyl acrylate, 2-pheonoxyethyl methcrylate, 3,3,5-trimethylcyclohexyl methcrylate, isobornyl acrylate, isobornyl methcrylate, isodecyl acrylate, isodecyl methcrylate, isooctyl acrylate, lauryl acrylate, stearyl acrylate, tetrahydrofurfuryl acrylate, tridecyl acrylate, etc. These can be used alone or in combination with each other.

When an amount of the monomer is less than about 5% by weight based on the total weight of the photoresist composition, sensitivity of the photoresist composition may be decreased. When an amount of the monomer is greater than about 10% by weight, although sensitivity of the photoresist composition may be increased, photo margins in the process of forming the color filter may not be finely tuned. Thus, an amount of the monomer may be about 5% by weight to about 10% by weight based on the total weight of the photoresist composition.

(c) Photo Initiator

The photo initiator according to the present exemplary embodiment may include a compound activatable by light having a wavelength range of h-line, which is from about 400 nm to about 410 nm. The photo initiator generates a radical when irradiated with light. A curing reaction of the binder resin may be initiated and activated by the radical.

A digital exposure apparatus used in an exposure process for forming the color filter includes a plurality of micromirrors and a light source providing a light to the micromirror. When the light source emits light having a wavelength range of i-line, the micro-minors may be easily deteriorated and oxidized, thereby causing damage to the digital exposure apparatus. In order to prevent damage to the digital exposure apparatus, the digital exposure apparatus may use a light source providing light having a peak wavelength range of h-line. The photo initiator has high absorbance with respect the light having a peak wavelength range of h-line. Activity of the photo initiator by light provided by the light source may thereby be maximized. The activated photo initiator generates a radical, so that photoreaction of the photoresist composition may be initiated. Thus, photosensitivity with respect to light having a peak wavelength range of h-line may be improved by the photoresist composition.

Examples of the photo initiator include a bis acyl phosphine based compound, metallocene based compound, a mono acyl phosphine based compound, an α-hydroxyketone based compound, etc. These can be used alone or in combination with each other.

Particularly, examples of the photo initiator include IRGACURE 819 [trade name, available from Ciba-Geigy, Switzerland, phenyl bis(2,4,6-trimethyl benzoyl)phosphine oxide], DAROCUR TPO [trade name, available from Ciba-Geigy, Switzerland, diphenyl (2,4,6-trimethylbenzoyl) phosphine oxide], IRGACURE 2100 [trade name, available from Ciba-Geigy, Switzerland, phenylbis(2,4,6-trimethylbenzoyl) phosphine oxide], DAROCUR 1173 [trade name, available from Ciba-Geigy, Switzerland, 2-Hydroxy-2-methyl-1-phenyl-1-propanone], IRGACURE 784 [trade name, available from Ciba-Geigy, Switzerland, bis(eta 5-2,4-cyclopentadien-1-yl)bis[2,6-difluoro-3-(1H-pyrrol-1-yl)phenyl]titanium], etc. These can be used alone or in combination with each other.

For example, IRGACURE 369 may be used in a conventional photoresist composition, and has a maximum (i.e., peak) absorbance with respect to a light having a wavelength of about 365 nm, which corresponds to i-line. Absorbance of light having a wavelength of about 405 nm, which corresponds to h-line, is low. However, according to the present exemplary embodiment, IRGACURE 819 may be used in the photoresist composition, and absorbance of light having a wavelength of about 405 nm may be maximized. Thus, optical characteristics of the photoresist composition according to the present exemplary embodiment may be optimized in a digital exposure apparatus using a light source emitting light having a peak wavelength range of h-line.

When an amount of the photo initiator is less than about 1% by weight based on the total weight of the photoresist composition, reactivity of the photoresist composition may be very low with respect to irradiated light, and photoreaction of the photoresist composition is insufficient to cure the photoresist. When an amount of the photo initiator is greater than about 15% by weight, controlling a photoreaction speed of the photoresist composition may be difficult. Furthermore, photoreaction in a lower part of the coated layer may be less than in a surface part of the coated layer. Thus, an amount of the photo initiator may be about 1% by weight to about 15% by weight based on the total weight of the photoresist composition. An amount of the photo initiator may preferably be about 1% by weight to about 5% by weight.

(d) Pigment

The pigment according to the present exemplary embodiment serves to represent color of the photoresist composition. Compounds in the pigment are mixed so that the photoresist composition may form a color filter representing various colors. Examples of the pigment may include C.I. Pigment Red 177, C.I. Pigment Red 254, C.I. Pigment Green 36, or C.I. Pigment Blue 156, etc. These can be used alone or in combination with each other.

When an amount of the pigment is less than about 1% by weight based on the total weight of the photoresist composition, coloring effect of the color filter by the pigment may be insufficient, and color reproducibility lowered. When an amount of the pigment is greater than about 10% by weight based on the total weight of the photoresist composition, transmittance of the color filter may be lowered and display quality may be lowered. Thus, an amount of the pigment may be about 1% by weight to about 10% by weight based on the total weight of the photoresist composition.

(e) Pigment Dispersing Agent

The pigment dispersing agent according to the present exemplary embodiment is serves to cover a surface of the pigment so that cohesion between adjacent pigments may be inhibited. Thus, the pigment in the photoresist composition may be uniformly dispersed by the pigment dispersing agent.

Examples of the pigment dispersing agent may include BYK-200 (trade name, available from BYK-chemie, Germany), BYK-2001, BYK-161, BYK-163, BYK-160, BYK-161, PD-7000 (trade name, available from CRODA, Germany), DFKA-4330 (trade name, available from BASF, Germany) or DISPERS-650 (trade name, available from Evonik, Germany). These can be used alone or in combination with each other.

When an amount of the pigment dispersing agent is less than about 0.01% by weight based on the total weight of the photoresist composition, the pigment may not be dispersed. When an amount of the pigment dispersing agent is greater than about 1% by weight based on the total weight of the photoresist composition, the pigment dispersing agent in the photoresist composition may reduce coloring effect of the pigment. Thus, an amount of the pigment dispersing agent may be about 0.01% by weight to about 1% by weight.

(f) Solvent

The solvent according to the present exemplary embodiment serves to disperse and solubilize the binder resin, the monomer, the photo initiator, the pigment, and the pigment dispersing agent. The solvent is not limited to a specific material. However, a material, of which drying speed may be controllable, may be used so that a uniform and planar coated layer is formed after the solvent is vaporized. Examples of the solvent may include propylene glycol monomethyl ether acetate, ethyl ethoxy propionate, cyclohexanone, dipropylene glycol monomethyl ether acetate, n-butylacetate, isobutyl acetate, ethylene glycol monomethyl acetate, ethylene glycol n-butyl acetate, diethylene glycol dimethyl ether, dipropylene glycol monomethyl acetate, diethylene glycol methyl ether, dipropylene glycol n-butyl ether, tripropylene glycol n-butyl ether, tripropylene glycol methyl ether, propylene glycol methyl ether acetate, propylene glycol diacetate, 3-ethoxy prionate acid methyl, methnol, ethanol, methyl cellusolve monomethyl ether, ethyl cellusolve acetate, diethylene glycol monomethyl ether, methylethyl ketone, 4-hydroxy 4-methyl 2-pentanone, or 2-hydroxy 2-methylproprionate acid ethyl, etc. These can be used alone or in combination with each other.

The solvent includes a remainder of the amount of the photoresist composition except the binder resin, the monomer, the photo initiator, the pigment, and the pigment dispersing agent. The binder resin, the monomer, the photo initiator, the pigment, the pigment dispersing agent, and the solvent are combined such that total weight of the photoresist composition may be about 100% by weight.

For example, when the binder resin is about 5% by weight to about 10% by weight, the photo monomer may be about 5% by weight to about 10% by weight, the photo initiator may be about 1% by weight to about 15% by weight, the pigment may be about 1% by weight to about 10% by weight, and the pigment dispersing agent may be about 0.01% by weight to about 1% by weight, and the solvent may be about 54.99% by weight to about 73.99% by weight.

The photoresist composition according to another exemplary embodiment of the present invention may include a sensitizer, a wavelength shifter, additives, or a combination thereof. Hereinafter, the sensitizer, the wavelength shifter, and the additives will be illustrated in detail.

(g) Sensitizer

The sensitizer according to the present exemplary embodiment serves to lower is activation energy of the photo initiator. The sensitizer may increase light absorption of the photoresist composition. Thus, when the photoresist composition includes the photo initiator and the sensitizer, an amount of the photo initiator may be reduced by the sensitizer. The multi-functional monomer and the mono-functional monomer used as the monomer may have various types. Thus, photo margins of the photoresist composition may be finely tuned.

Examples of the sensitizer may include diethylenethioxanthone (DETX), violanthrone, isoviolanthrone, fluoresceine, rubrene, 9,10-diphenylanthracene, tetracene, 13,13"-dibenzanthrone, or levulinic acid, etc. These can be used alone or in combination with each other.

When an amount of the sensitizer is greater than about 5% by weight based on the total weight of the photoresist composition, solubility of the photoresist composition may be decreased. Thus, an amount of the sensitizer may be less than about 5% by weight. An amount of the sensitizer may be about 0% by weight to about 5% be weight according to the present exemplary embodiment. When the photoresist composition includes the sensitizer according to the present exemplary embodiment, the solvent may be about 49.99% by weight to about 68.99% by weight.

(h) Wavelength Shifter

The wavelength shifter according to the present exemplary embodiment supports the photo initiator and the sensitizer. Thus, sensitivity of the photoresist composition with respect to light having a peak wavelength range of h-line may be improved. Using the wavelength shifter, a wavelength range of light absorbed by the photoresist composition may be more easily shifted than wavelength range of h-line.

Examples of the wavelength shifter may include n-(2-phenyl-1,3-benzoxazol-5-yl)naphthalene-1-1carboxamide, or 7-(diethylamino)-4-(trifluoromethyl)-2H-chromen-2-one, etc. These can be used alone or in combination with each other.

When an amount of the wavelength shifter is greater than about 8% by weight based on the total weight of the photoresist composition, an amount of reacting compound upon irradiation of light with the photo initiator and the sensitizer may be excessive, and controlling photosensitivity of the photoresist composition may be difficult. Thus, an amount of the wavelength shifter may be about 8% by weight. An amount of the wavelength shifter may be about 0% by weight to about 8% by weight according to the present exemplary embodiment.

When the photoresist composition including the photo initiator and the sensitizer includes the wavelength shifter, the solvent may be about 41.99% by weight to about 60.99% by weight.

(i) Additives

The photoresist composition according to the present exemplary embodiment may include a surfactant and an adhesion enhancer. An amount of the additives may be about 0% by weight to about 1% by weight based on the total weight of the photoresist composition. When an amount of the additives is greater than about 1% by weight, characteristic of the photoresist composition may be lowered by the additives. Hereinafter, the surfactant and the adhesion enhancer used as additives will be illustrated in detail.

(i-1) Surfactant

The surfactant may decrease interfacial tension between the color filter formed from the photoresist composition, an under of color filter, or a substrate. Thus, the coated layer may be uniformly formed on the lower film or the substrate. Examples of the surfactant may include FZ-2110 (trade name, available from Dow Corning, U.S), FZ-2122, BYK-345 (trade name, available from BYK, U.S), BYK346, or BYK-34, etc. These can be used alone or in combination with each other.

(i-2) Adhesion Enhancer

When the substrate is a glass substrate formed from an inorganic material, adhesion between the photoresist composition and the glass substrate may be improved by the adhesion enhancer. The adhesion enhancer may include a melamine crosslinking agent or a silane coupling agent having an organic functional group and an inorganic functional group.

Examples of the silane coupling agents may include KBM-303 (trade name, available from Shin-Etsu, Japan), KBM-403, KBE-402, or KBE-40, etc. These can be used alone or in combination with each other. Furthermore, examples of the melamine cros slinking agent may include MW-30M (trade name, available from Vision Tech, Korea), MX706 (trade name, available from Vision Tech, Korea), etc.

The photoresist composition according to an exemplary embodiment of the present invention may include the photo initiator activatable by light having a peak wavelength range of h-line from about 400 nm to about 410 nm. Thus, optical characteristics with respect to an exposure apparatus including a light source emitting a light of h-line may be improved. Also, the photoresist composition may further include the sensitizer. Thus, optical characteristics with respect to the exposure apparatus may be improved. Furthermore, the photoresist composition including the sensitizer may further include the wavelength shifter. Thus, optical characteristics with respect to the exposure apparatus may be improved and manufacturing reliability of the color filter formed from the photoresist composition may be improved.

Hereinafter, a method of forming a color filter using the photoresist composition according to the present invention will be described in detail below with reference to the is accompanying drawings.

Figure 1:
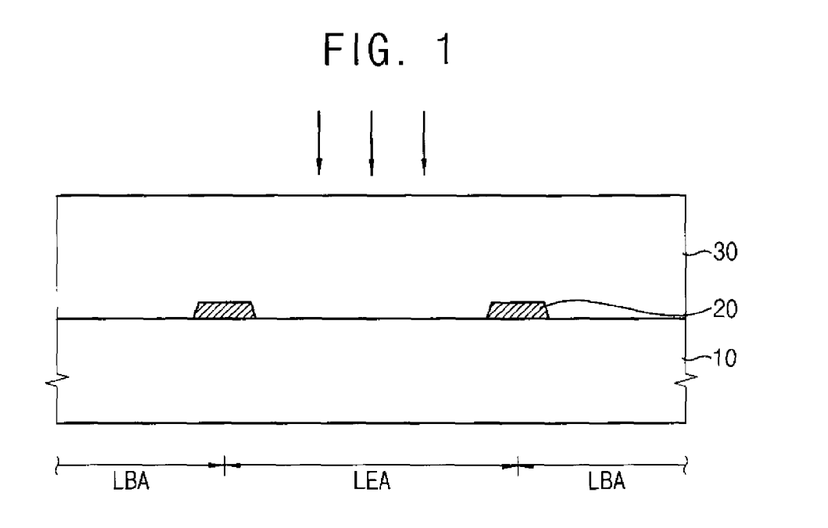
FIG. 1 is a cross-sectional view illustrating an exposure process in a method of manufacturing a color filter according to an exemplary embodiment of the present invention.

FIG. 1 is a cross-sectional view illustrating an exposure process in a method of manufacturing a color filter according to an exemplary embodiment of the present invention.

Referring to FIG. 1, a light blocking pattern 20 is formed on a base substrate 10. A photoresist composition is coated on the base substrate 10 having the light blocking pattern 20 to form a coated layer 30 for manufacturing a color filter.

Examples of the base substrate 10 may include a glass substrate and a soda lime substrate.

The light blocking pattern 20 may include a first stripe pattern and a second stripe pattern. The first stripe pattern extends in a first direction on the base substrate 10. The second stripe pattern extends in a second direction on the base substrate 10. The first direction and the second direction intersect and cross each other. By the first and the second stripe patterns, the light blocking pattern 20 may define a plurality of openings disposed to form a matrix shape on the base substrate 10. The light blocking pattern 20 may be formed by patterning a light-blocking film through a photo-etching process. Alternatively, according to another exemplary embodiment of the present invention, the light blocking pattern 20 may be omitted.

The photoresist composition for manufacturing the color filter may include a binder resin, a monomer, a photo initiator activatable by light having a wavelength range from about 400 nm to about 410 nm, a pigment, a pigment dispersing agent, and a remainder of solvent. The photoresist composition may further include a sensitizer and/or a wavelength shifter. The photoresist composition for manufacturing the color filter according to the present exemplary embodiment is substantially the same as the photoresist composition described above. Thus, overlapping description will be omitted. As kind of the pigment in the photoresist composition, color of the color filter formed from the photoresist composition may be determined.

A dipping method, a spraying method, or a spin coating method, for example, may be used to form the coated layer 30. The coated layer 30 may be pre-baked so that the solvent in the photoresist composition evaporates. Solid components except for the solvent may not be decomposed by heat and may remain on the base substrate 10.

Thereafter, the base substrate 10 that the coated layer 30 is formed on is exposed to a light. In the process of exposing the coated layer 30 to the light, light having a peak wavelength range of h-line is used. Particularly, a peak wavelength range of h-line is about 400 nm to about 410 nm. In the process of exposing the coated layer 30 to the light, the coated layer 30 without an additional mask is exposed, a digital exposure apparatus 300 illustrated in FIG. 2 including a light source 200 emitting a light having a peak wavelength range of h-line is used. The digital exposure apparatus 300 may selectively determine an area where the light is provided and an area where the light is not provided. The digital exposure apparatus 300 may to not provide the light to a light blocking area (LBA) of the base substrate 10 and may provide the light to a light exposure area (LEA) without an additional mask being formed on the coated layer 30.

Hereinafter, referring to FIGS. 2 and 3, the digital exposure apparatus 300 used in the exposure process for the coated layer 30 and the exposure process using the digital exposure apparatus 300 will be explained in detail.

Figure 2:
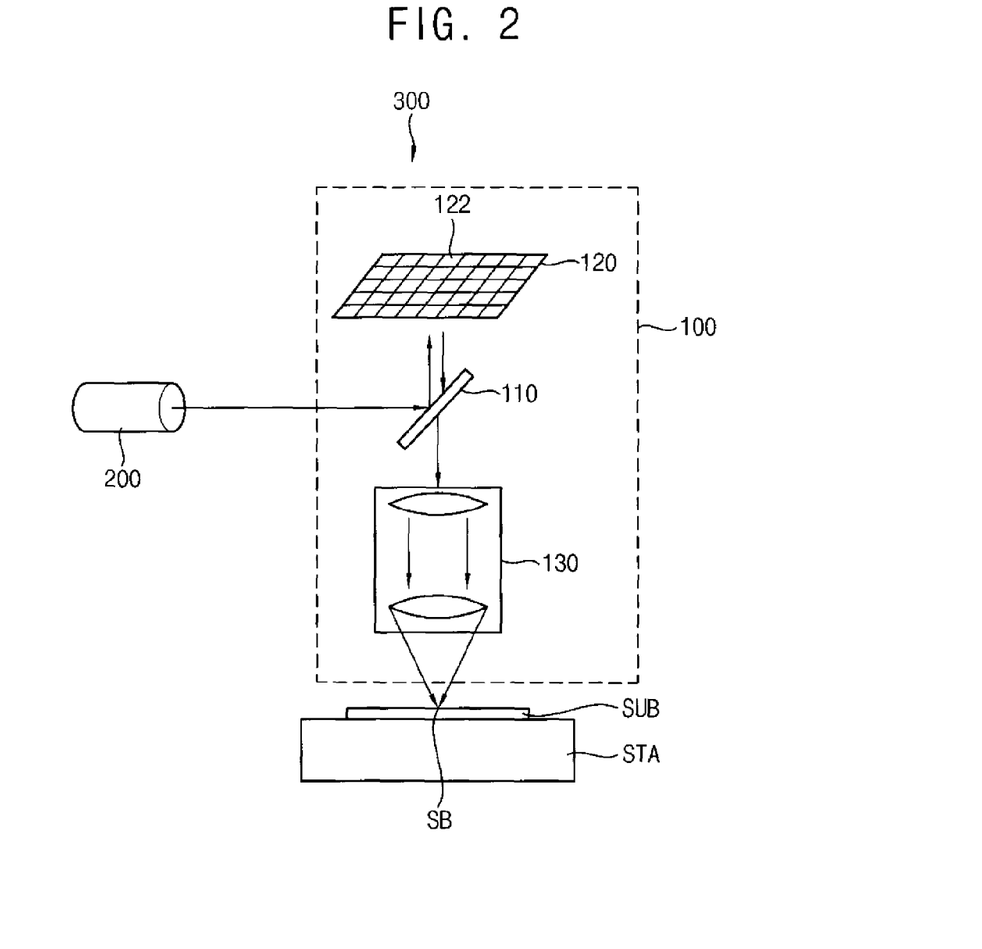
FIG. 2 is a cross-sectional view illustrating a digital exposure apparatus used in an exposure process in FIG. 1.

FIG. 2 is a cross-sectional view illustrating a digital exposure apparatus used in an exposure process illustrated in FIG. 1.

Referring to FIG. 2, the digital exposure apparatus 300 may include a light source 200 generating a light, an optical head 100 provided with the light from the light source 200 and a stage STA provided with the light from the optical head 100. The base substrate, which is illustrated in FIG. 1 and has the coated layer 30, is disposed on the stage STA. In FIG. 2, the base substrate 10 having the coated layer 30 is referred as a substrate SUB.

The light source 200 may provide a laser beam to the optical head 100. The light source 200 may provide a light having a peak wavelength range of h-line to the optical head 100. The light source 200 generates a light having a peak wavelength range of h-line, so that micro-mirrors 122 of the optical head 100 may be prevented from being deteriorated and oxidized.

The optical head 100 may include a beam splitter 110, a digital micro-mirror device (DMD) 120, and an optical system 130. Particularly, the beam splitter 110 reflects and transmits the laser beam that is provided from the light source 200. The laser beam reflected by the beam splitter 110 is provided to the DMD 120. A light provided by the DMD 120 is transmitted by the beam splitter 110, and then provided to the optical system 130.

The DMD 120 includes a plurality of micro-minors 122. The micro-mirrors 122 may be arranged to form m×n matrix shape. Each of the micro-minors 122 may reflect light provided from the beam splitter 110. The DMD 120 may selectively reflect light that is provided from the beam splitter 110 based on image data that is may be transcribed to the substrate SUB. The optical head 100 may further include a mirror control part (not shown). The minor control part may control each of the micro-mirrors 122 based on the image data. The mirror control part may output a signal controlling an on/off of the micro-mirrors 122. When all of the micro-mirrors 122 receive an on-data from the mirror control part, reflection beams, of which the number may be substantially identical with the number of the micro-mirrors 122, may be outputted to the optical system 130.

The optical system 130 may include a plurality of lenses. The optical system 130 may serve to change the reflection beams that are incident from the DMD 120 into a plurality of spot beams SB. The optical system 130 may condense the reflection beams that are incident from the DMD 120 and may expand a distance between the reflection beams.

The spot beams SB may be irradiated on the substrate SUB that is placed on the stage STA by the digital exposure apparatus 300. The coated layer 30 formed on the base substrate 10 is not provided with a light in the light blocking area LBA. However, the coated layer 30 may be provided with a light in the light exposure area LEA.

Figure 3:
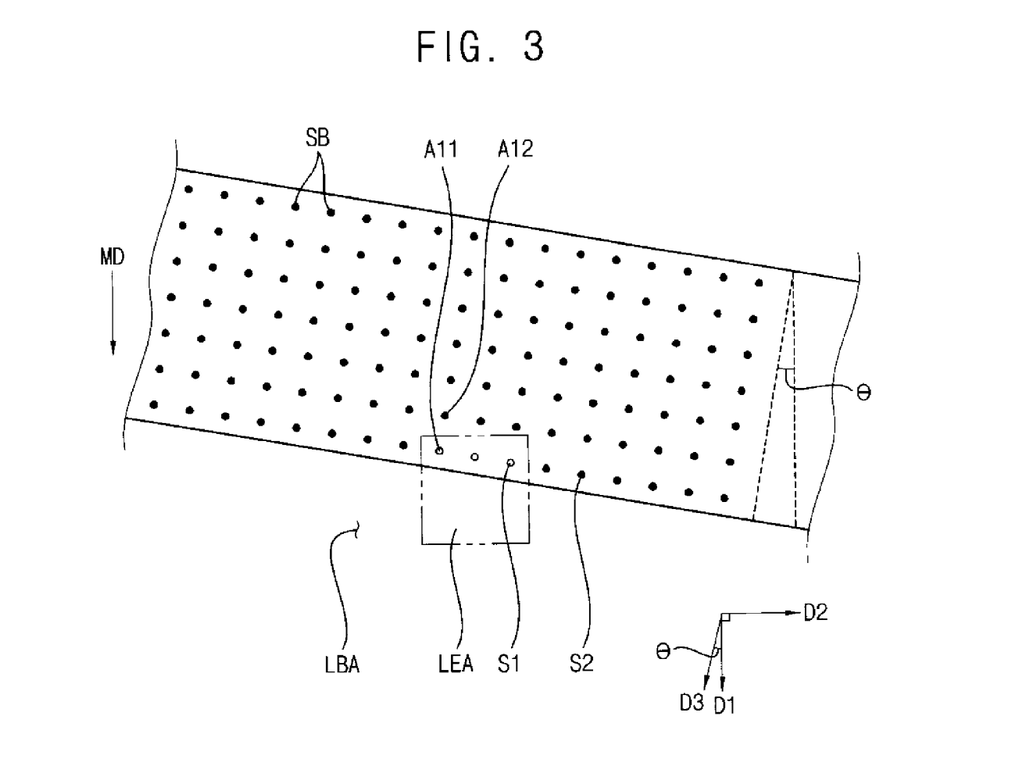
FIG. 3 is a plan view illustrating an exposure process using a digital exposure apparatus shown in FIG. 2.

FIG. 3 is a plan view illustrating an exposure process using a digital exposure apparatus shown in FIG. 2.

Referring to FIG. 3, the DMD 120 is attached to the substrate SUB with a predetermined tilt angle (θ) to expose a line or an area to a light, the line or area extending in a second direction D2 substantially perpendicular to a first direction D1 that is referred to as a scan direction MD. Thus, the substrate SUB and the DMD 120 are disposed to be inclined in a third direction D3. While the position of the DMD 120 is fixed, when the substrate SUB moves in a direction MD, spot beams SB are irradiated to be overlapped with each other in an area of the substrate SUB. The spot beams SB may be selectively provided on the substrate SUB according to the on/off of the micro-mirror 122.

For example, a micro-minor 122 in the light blocking area LBA is provided with off-data. A micro-minor 122 in the light exposure area LEA is provided with on-data. When the micro-mirror 122 is provided with off-data, the spot beam SB is not provided on the substrate SUB. When the micro-mirror 122 is provided with on-data, the spot beam SB is provided on the substrate SUB. Thus, when the micro-minor 122 is provided with off-data and is disposed in the light blocking area LBA, a spot is indicated as "•" and is defined as a "light blocking spot". When the micro-mirror 122 is provided with on-data and is disposed in the light exposure area LEA, a spot is indicated as "○" and is defined as a "light exposure spot".

As illustrated in FIG. 3, when image data about the light exposure area LEA, which may have a quadrangular shape in a plan view, is inputted to the digital exposure apparatus 300, on/off data is transferred to each of the micro-mirrors 122.

When the micro-mirror 122 is disposed in the light exposure area LEA, the micro-mirror 122 receives on-data thereby defining a light exposure spot A11 on the substrate SUB. When the micro-mirror 122 is disposed in the light blocking area LBA, the micro-mirror 122 receives off-data thereby defining a light blocking spot A12 on the substrate SUB. As the substrate SUB moves in the scan direction MD, the micro-mirror 122 having defined the light blocking spot A12 in the light exposure area LEA in the previous step is disposed in the light exposure area LEA. Thus, the micro-minor 122 having defined the light blocking spot A12 in the light exposure area LEA receives on-data, thereby defining the light exposure spot of the substrate SUB. Accordingly, the light exposure area LEA may be provided with the spot beam SB, and the light blocking area LBA may not provided with the spot beam SB.

Figure 4:
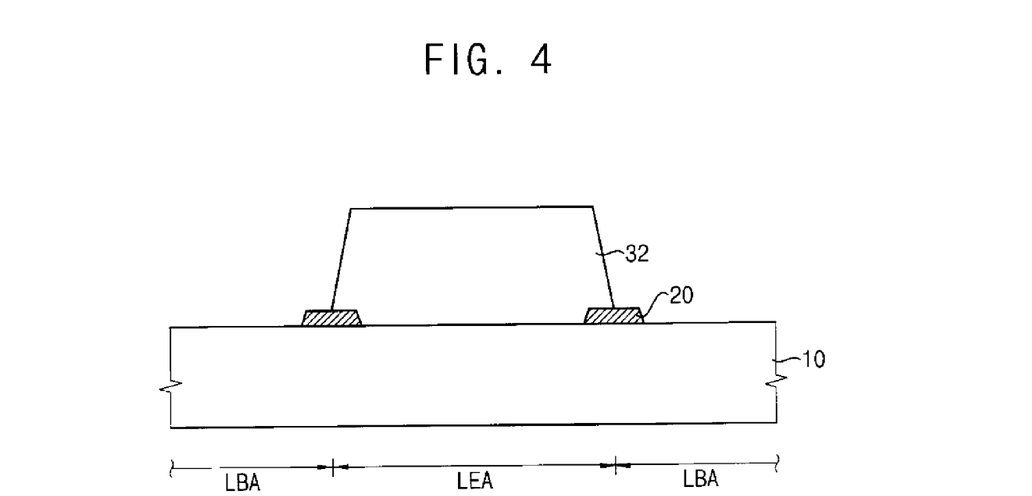
FIG. 4 is a cross-sectional view illustrating a developing process performed after an exposure process in FIG. 1.

FIG. 4 is a cross-sectional view illustrating a developing process performed after an exposure process described above with respect to FIG. 1 according to an exemplary embodiment of the present invention.

Referring to FIG. 1 and FIG. 4, the exposed coated layer 30 irradiated with light by the digital exposure apparatus 300 is developed to form a color filter 32.

The coated layer 30 may be dipped in a developer such as tetramethyl ammonium hydroxide (TMAH), or the developer may be coated on the base substrate 10 having the coated layer 30. In a developing process of the coated layer 30, the coated layer 30 in the light exposure area LEA remains on the base substrate 10. The coated layer 30 in the light blocking area LBA is dissolved by the developer so that coated layer 30 may be removed from the base substrate 10. Thus, a first color filter 32 is formed on the base substrate 10.

In addition, the base substrate 10 having the first color filter 32 may be post-baked. Through the post-bake process, an adhesive property between the first color filter 32 and the base substrate 10 and chemical resistance of the first color filter 32 may be improved. The post-bake process may be performed at temperature less than a softening temperature of the color filter 32.

Figure 5:
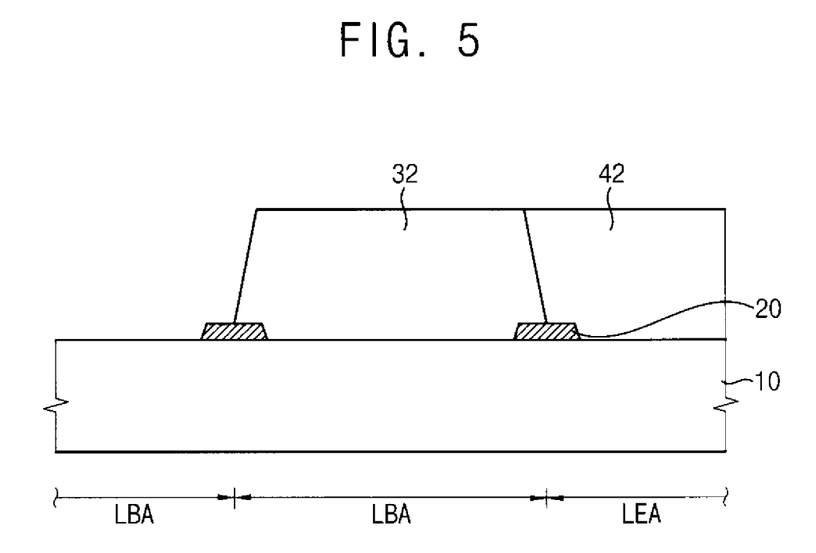
FIGS. 5 and 6 are cross-sectional views illustrating a method of manufacturing a substrate to use a display apparatus including a color filter shown in FIG. 4.
Figure 6:
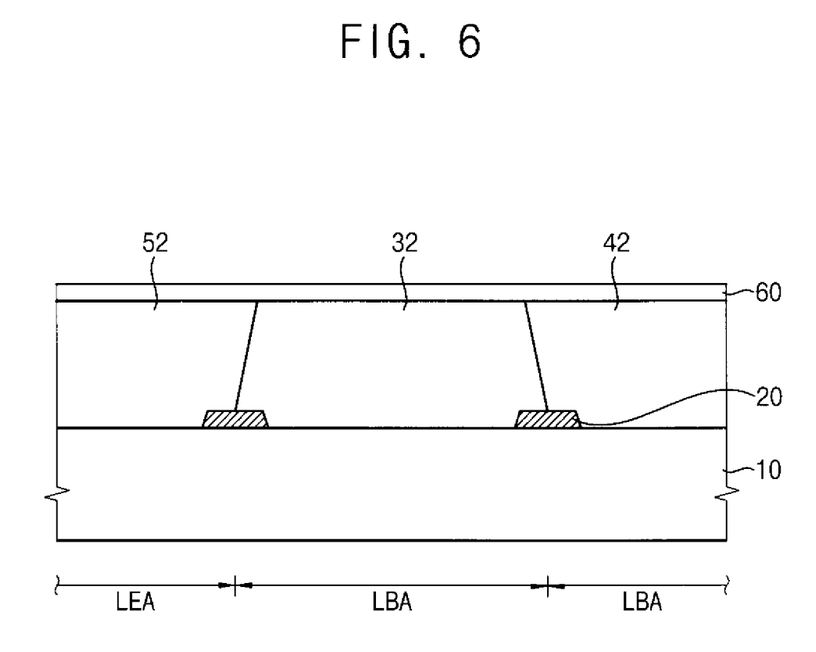

FIGS. 5 and 6 are cross-sectional views illustrating a method of manufacturing a substrate for a display apparatus including a color filter illustrated in FIG. 4 according to an exemplary embodiment of the present invention.

Referring to FIG. 5, a second color filter 42 is formed on the base substrate 10 having the first color filter 32. The second color filter 42 is formed from a photoresist composition substantially identical with the photoresist composition for forming the first color filter 32, except for a pigment. The second color filter 42 may be formed through substantially same processes illustrated in FIG. 1 to FIG. 4. Thus, duplicated description thereof will be omitted.

In the process of forming the second color filter 42, a coated layer may be dipped in a developer, or the developer may be coated on the base substrate 10 having the coated layer. In a developing process of the coated layer, the coated layer in the light exposure area LEA remains on the base substrate 10. The coated layer in the light blocking area LBA is dissolved by the developer so that coated layer may be removed from the base substrate 10. The first color filter 32 may not be dissolved by the developer. Thus, a second color filter 42 may be formed on the base substrate 10 along with the previously formed first color filter 32.

A pigment included in the photoresist composition for forming the second color filter 42 may be different from a pigment that is included in the photoresist composition for forming the first color filter 32. For example, the first color filter 32 may represent red, and the second color filter 42 may represent green. In the process of forming the second color filter 42, the digital exposure apparatus 300 selectively providing a light may be used.

Referring to FIG. 6, a third color filter 52 and a common electrode 60 are formed on the base substrate 10 on which the first and second color filters 32 and 42 formed. The third color filter 52 except for a pigment may include a photoresist composition substantially identical with the photoresist composition forming the first color filter 32. The third color filter 52 may be formed through substantially same processes illustrated in FIG. 1 to FIG. 4. Thus, duplicated description thereof will be omitted.

In the process of forming the third color filter 52, a coated layer may be dipped in a developer, or the developer may be coated on the base substrate 10 having the coated layer. In a developing process of the coated layer, the coated layer in the light exposure area LEA remains on the base substrate 10. The coated layer in the light blocking area LBA is dissolved by the developer so that coated layer may be removed from the base substrate 10. The first and second color filters 32 and 42 may not be dissolved by the developer. Thus, a third color filter 52 may be formed on the base substrate 10 along with the previously formed first and second color filters 32 and 42.

A pigment included in the photoresist composition forming the third color filter 52 may be different from a pigment included in the photoresist composition forming the second color filter 42. For example, when the first color filter 32 represents red, the second color filter 42 represents green, the third color filter 52 may represent blue. In the process of forming the third color filter 52, the digital exposure apparatus 300 selectively providing a light in a formation area of the third color filter 52 may be used. Areas in which the first and second color filters 32 and 42 are formed are defined as light blocking areas in the process of forming the third color filter 52.

The common electrode 60 is formed on the base substrate 10 on which the first, second, and third color filters 32, 42, and 52 formed. The common electrode 60 may be a transparent material having conductivity. Examples of a material that may be used for the common electrode 60 may include indium tin oxide (ITO) or indium zinc oxide (IZO). The common electrode 60 may be omitted when a panel for an in-plane switching mode is used for a display apparatus.

As described above, the first, second, and third color filters 32, 42, and 52 using the photoresist composition according to the present exemplary embodiment may be formed by using the digital exposure apparatus 300 which does not require an additional mask. Thus, a manufacturing cost for forming the mask may be reduced. A photosensitivity with respect to light having a peak wavelength range of h-line may be improved by the photoresist composition according to the present invention, so that manufacturing reliability of the first, second, and third color filters 32, 42, and 52 may be improved.

As described above, a photoresist composition according to exemplary embodiments of the present invention for forming a color filter includes a photo initiator activatable by light having a peak wavelength range of h-line from about 400 nm to about 410 nm. Thus, optical characteristics with respect to a digital exposure apparatus may be improved. The photoresist composition for manufacturing a color filter may further include a sensitizer, a wavelength shifter, or a combination thereof. Thus, optical characteristics with respect to the digital exposure apparatus may be improved. Thus, manufacturing reliability of the color filter formed from the photoresist composition may also be improved.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A photoresist composition, comprising:
   about 5% by weight to about 10% by weight of a binder resin;
   about 5% by weight to about 10% by weight of a monomer;
   about 1% by weight to about 15% by weight of a photo initiator configured to be activated by light having a wavelength from about 400 nm to about 410 nm;
   about 1% by weight to about 10% by weight of a pigment;
   about 1% by weight to about 8% by weight of a wavelength shifter comprising n-(2-phenyl-1,3-benzoxazol-5-yl)naphthalene-1-1carboxamide;
   about 0.01% by weight to about 1% by weight of a pigment dispersing agent; and
   a solvent.

2. The photoresist composition of claim 1, wherein the photo initiator comprises at least one of a bis acyl phosphine based compound, a metallocene based compound, a mono acyl phosphine based compound, and an α-hydroxyketone based compound.

3. The photoresist composition of claim 1, wherein the photo initiator comprises at least one selected of phenyl bis (2,4,6-trimethyl benzoyl) phosphine oxide, diphenyl (2,4,6-trimethylbenzoyl) phosphine oxide, phenylbis(2,4,6-trimethylbenzoyl) phosphine oxide, 2-hydroxy-2-methyl-1-phenyl-1-propanone], and bis(eta 5-2,4-cyclopentadien-1-yl) bis[2,6-difluoro-3-(1H-pyrrol-1-yl)phenyl]titanium.

4. The photoresist composition of claim 1, further comprising a sensitizer in an amount up to about 5% by weight of the photoresist composition.

5. The photoresist composition of claim 4, wherein the sensitizer comprises at least one of diethylenethioxanthone (DETX), violanthrone, isoviolanthrone, fluoresceine, rubrene, 9,10-diphenylanthracene, tetracene, 13,13"-dibenzanthrone, and levulinic acid.

6. The photoresist composition of claim 1, wherein the wavelength shifter further comprises 7-(diethylamino)-4-(trifluoromethyl)-2H-chromen-2-one.

7. The photoresist composition of claim 1, wherein the pigment comprises at least one of C.I. Pigment Red 177, C.I. Pigment Red 254, C.I. Pigment Green 36, and C.I. Pigment Blue 156.

8. The photoresist composition of claim 1, wherein the binder resin comprises an acrylic resin.

9. A method of forming a color filter, the method comprising:
   forming a coated layer on a substrate, the coated layer comprising a photoresist composition comprising a binder resin, a monomer, a photo initiator configured to be activated by light having a peak wavelength from about 400 nm to about 410 nm, a pigment, a wavelength shifter, a pigment dispersing agent, and a solvent;
   exposing the coated layer to light having a peak wavelength from about 400 nm to about 410 nm using a digital exposure apparatus; and
   developing the coated layer,
   wherein the wavelength shifter comprises n-(2-phenyl-1,3-benzoxazol-5-yl)naphthalene-1-1carboxamide.

10. The method of claim 9, the photoresist composition comprising:
    about 5% by weight to about 10% by weight of the binder resin;
    about 5% by weight to about 10% by weight of the monomer;
    about 1% by weight to about 15% by weight of the photo initiator;
    about 1% by weight to about 10% by weight of the pigment;
    about 0.01% by weight to about 1% by weight of the pigment dispersing agent; and
    the remainder of the photoresist composition comprising the solvent.

11. The method of claim 9, wherein the photo initiator comprises at least one of bis acyl phosphine based compound, metallocene based compound, mono acyl phosphine based compound, and α-hydroxyketone based compound.

12. The method of claim 11, wherein the photo initiator comprises at least one of phenyl bis (2,4,6-trimethyl benzoyl) phosphine oxide, diphenyl (2,4,6-trimethylbenzoyl) phosphine oxide, phenylbis(2,4,6-trimethylbenzoyl) phosphine oxide, 2-hydroxy-2-methyl-1-phenyl-1-propanone, and bis (eta 5-2,4-cyclopentadien-1-yl) bis[2,6-difluoro-3-(1H-pyrrol-1-yl)phenyl]titanium.

13. The method of claim 9, wherein exposing the coated layer comprises:
    irradiating a plurality of spot beams onto the coated layer using a plurality of micro-mirrors in the digital exposure apparatus, wherein the spot beams are overlapped with each other on the coated layer by selectively turning the plurality of micro-mirrors on and off.

14. The method of claim 9, wherein the photoresist composition further comprises a sensitizer including at least one of diethylenethioxanthone (DETX), violanthrone, isoviolanthrone, fluoresceine, rubrene, 9,10-diphenylanthracene, tetracene, 13,13"-dibenzanthrone, and levulinic acid.

15. The method of claim 9, wherein the wavelength shifter further comprises 7 (diethylamino)-4-(trifluoromethyl)-2H-chromen-2-one.

16. A method of forming a color filter, the method comprising:
    forming a coated layer on a substrate, the coated layer comprising a photoresist composition comprising about 5% by weight to about 10% by weight of a binder resin, about 5% by weight to about 10% by weight of a monomer, about 1% by weight to about 15% by weight of a photo initiator configured to be activated by light having a wavelength from about 400 nm to about 410 nm, about 1% by weight to about 10% by weight of a pigment, about 0.01% by weight to about 1% by weight of a pigment dispersing agent, about 1% by weight to about 8% by weight of a wavelength shifter, and a solvent;
    exposing the coated layer; and
    developing the exposed coated layer, wherein the wavelength shifter comprises n-(2-phenyl-1,3-benzoxazol-5-yl)naphthalene-1-1carboxamide.

17. The method of claim 16, wherein the photoresist composition further comprises a sensitizer including at least one of diethylenethioxanthone (DETX), violanthrone, isoviolanthrone, fluoresceine, rubrene, 9,10-diphenylanthracene, tetracene, 13,13"-dibenzanthrone, and levulinic acid.

18. The method of claim 16, wherein the wavelength shifter further comprises 7-(diethylamino)-4-(trifluoromethyl)-2H-chromen-2-one.

* * * * *